(12) United States Patent
Hatano et al.

(10) Patent No.: US 8,097,848 B2
(45) Date of Patent: Jan. 17, 2012

(54) SCANNING ELECTRON MICROSCOPE

(75) Inventors: Michio Hatano, Tokyo (JP); Sukehiro Ito, Hitachinaka (JP); Nagahide Ishida, Hitachinaka (JP); Shinichi Tomita, Hitachinaka (JP); Wataru Kotake, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 199 days.

(21) Appl. No.: 12/396,593

(22) Filed: Mar. 3, 2009

(65) Prior Publication Data
US 2009/0230304 A1    Sep. 17, 2009

(30) Foreign Application Priority Data
Mar. 13, 2008 (JP) .................................. 2008-064555

(51) Int. Cl.
*H01J 37/28* (2006.01)

(52) U.S. Cl. ..................... 250/310; 250/396 R; 250/397

(58) Field of Classification Search .................... 250/310
See application file for complete search history.

(56) References Cited

U.S. PATENT DOCUMENTS

| | | | | |
|---|---|---|---|---|
| 4,897,545 A | * | 1/1990 | Danilatos | 250/310 |
| 5,367,496 A | * | 11/1994 | Sullivan et al. | 367/7 |
| 5,393,977 A | * | 2/1995 | Okura et al. | 850/10 |
| 5,412,211 A | * | 5/1995 | Knowles | 250/310 |
| 6,130,429 A | * | 10/2000 | Ambe et al. | 250/310 |
| 6,797,965 B2 | * | 9/2004 | Abe | 250/491.1 |
| 6,972,412 B2 | * | 12/2005 | Scholtz et al. | 250/396 R |
| 2008/0035843 A1 | | 2/2008 | Hatano et al. | |

FOREIGN PATENT DOCUMENTS

| | | |
|---|---|---|
| JP | 9-501010 | 1/1997 |
| JP | 2001-126655 | 5/2001 |
| JP | 2003-132830 | 5/2003 |
| JP | 2006-228586 | 8/2006 |

OTHER PUBLICATIONS

G.D. Danilatos, "An Atmospheric Scanning Electron Microscope (ASEM)", Scanning vol. 3, pp. 215-217 1980.

* cited by examiner

*Primary Examiner* — Phillip A Johnston
(74) *Attorney, Agent, or Firm* — Mattingly & Malur, PC

(57) ABSTRACT

In a VP-SEM that uses gas multiplication induced within a low-vacuum sample chamber and uses a method of detecting a positive displacement current, a secondary electron detector for the VP-SEM that responds at high speed, which can acquire a TV-Scan rate image at a low cost while saving a space is provided. A secondary electron detector is formed by forming the electron supplying electrode and the detection electrode on the flexible thin film type substrate such as a polyimide film, etc., by an etching method. Thereby, the space can be saved while realizing low cost due to mass production. Further, the ion horizontally moving with respect to the surface of the secondary electron detector is detected and the ion moving in a vertical direction returned to the sample holder is not detected, making it possible to realize a high-speed response.

20 Claims, 18 Drawing Sheets

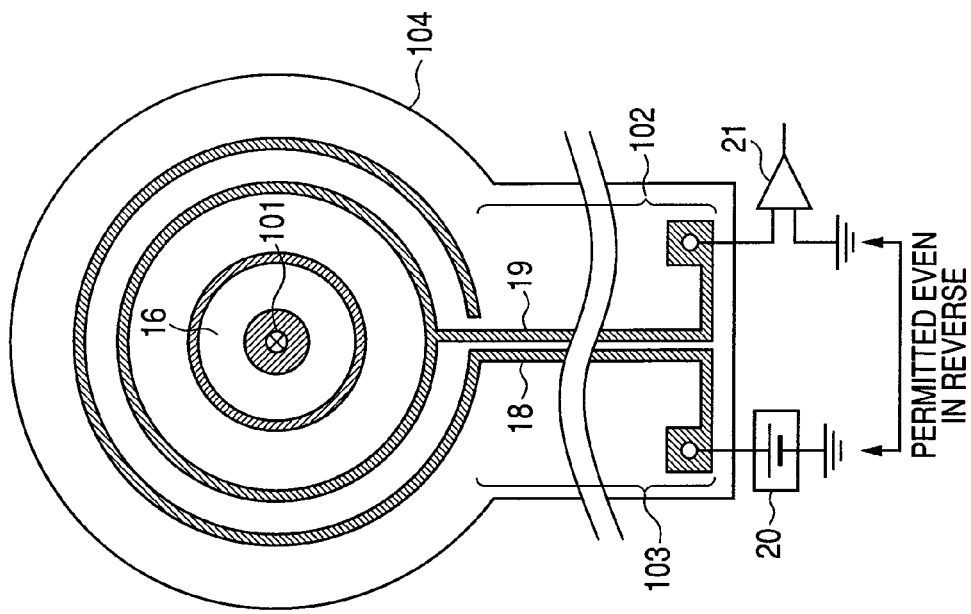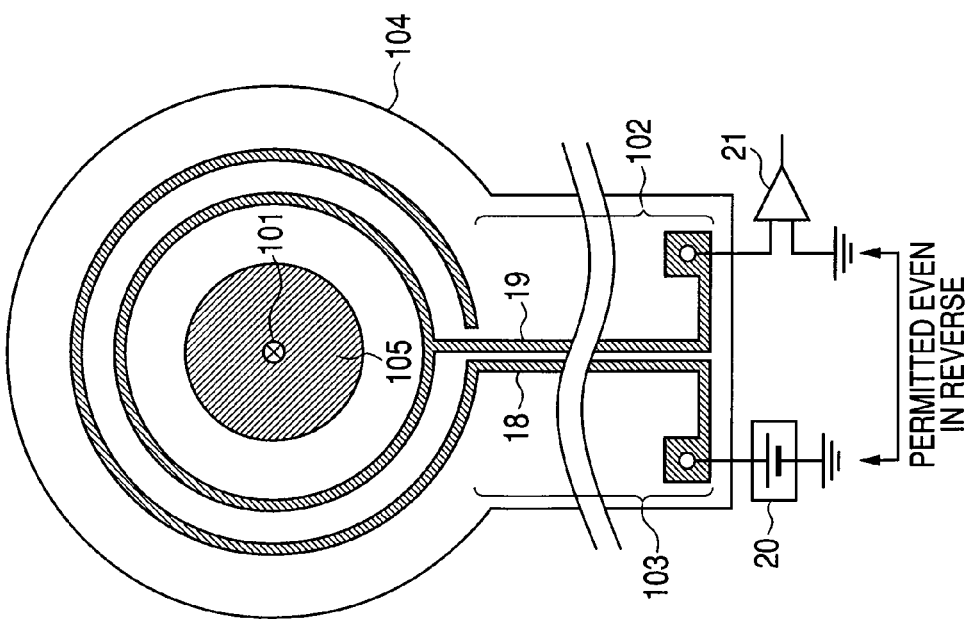

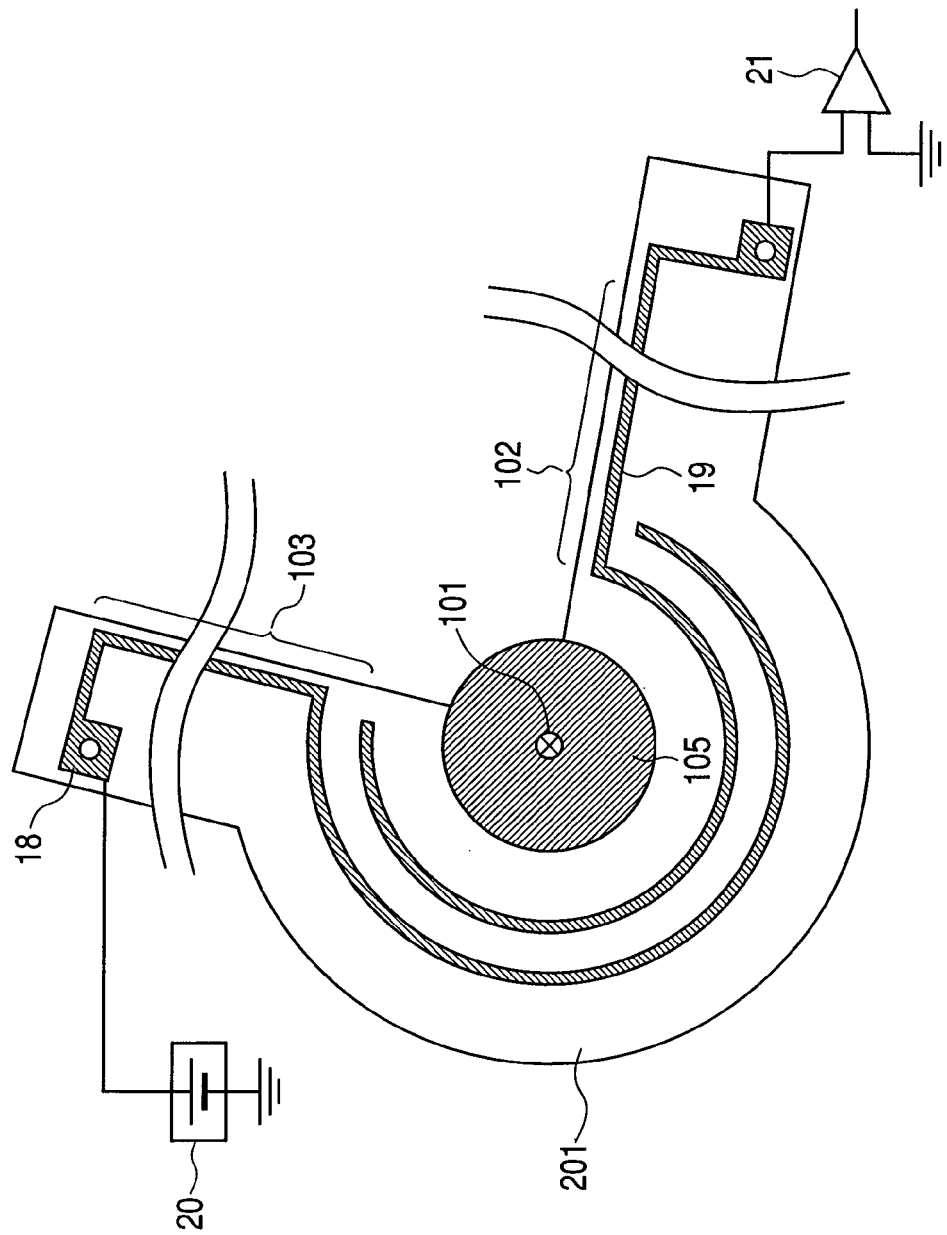

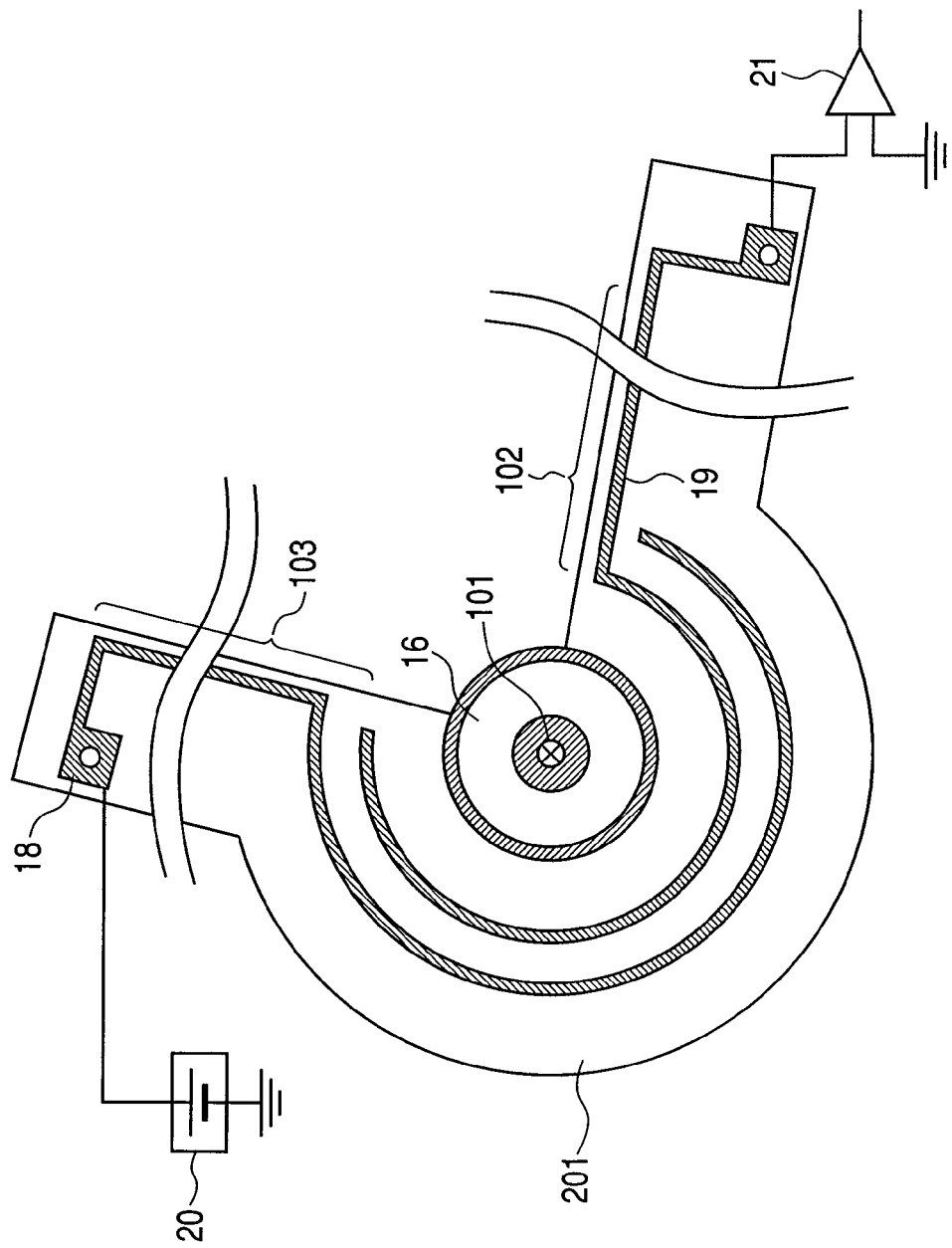

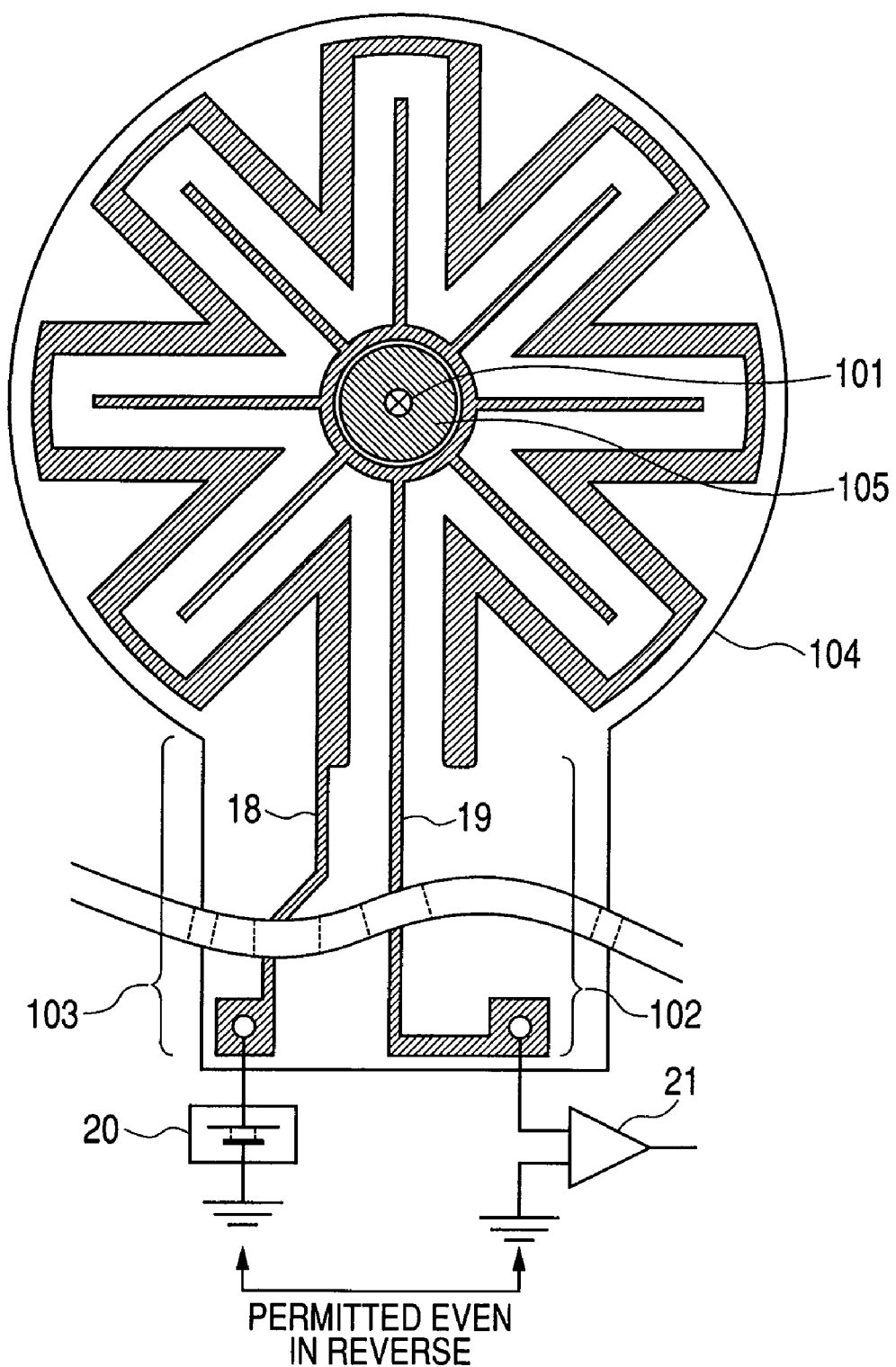

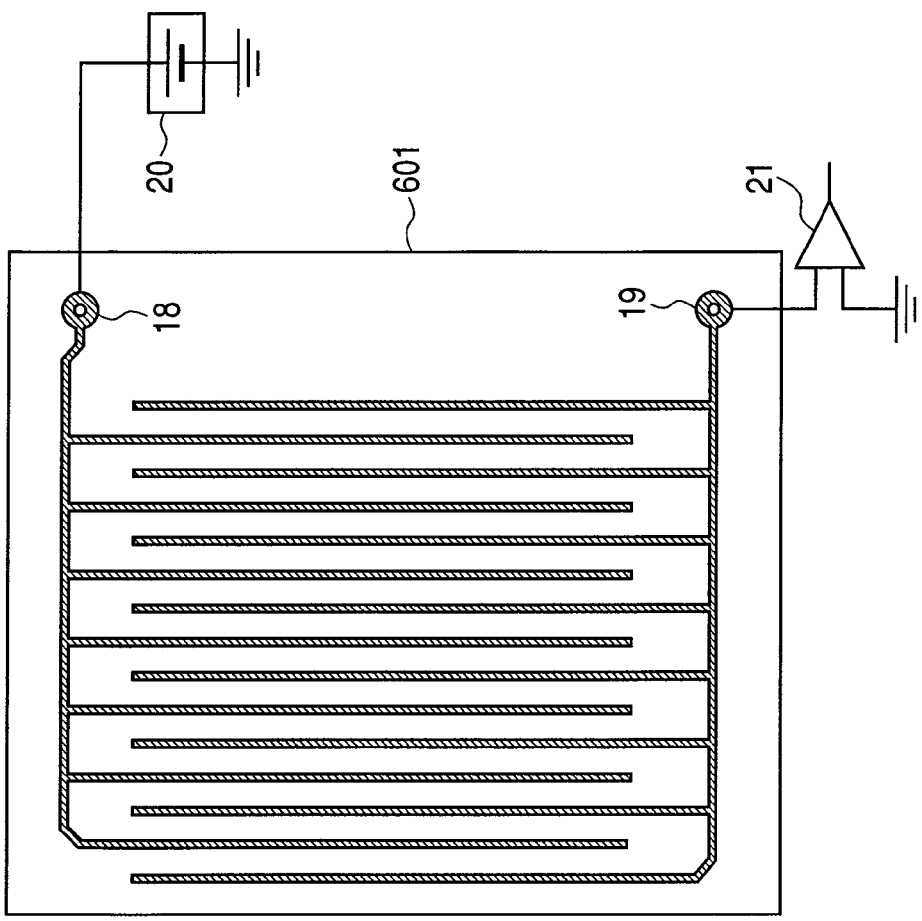
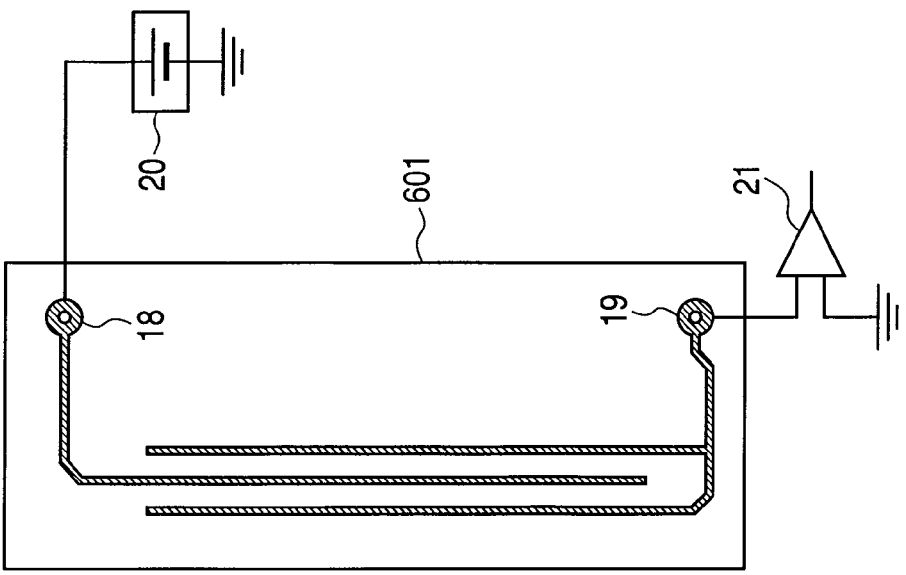

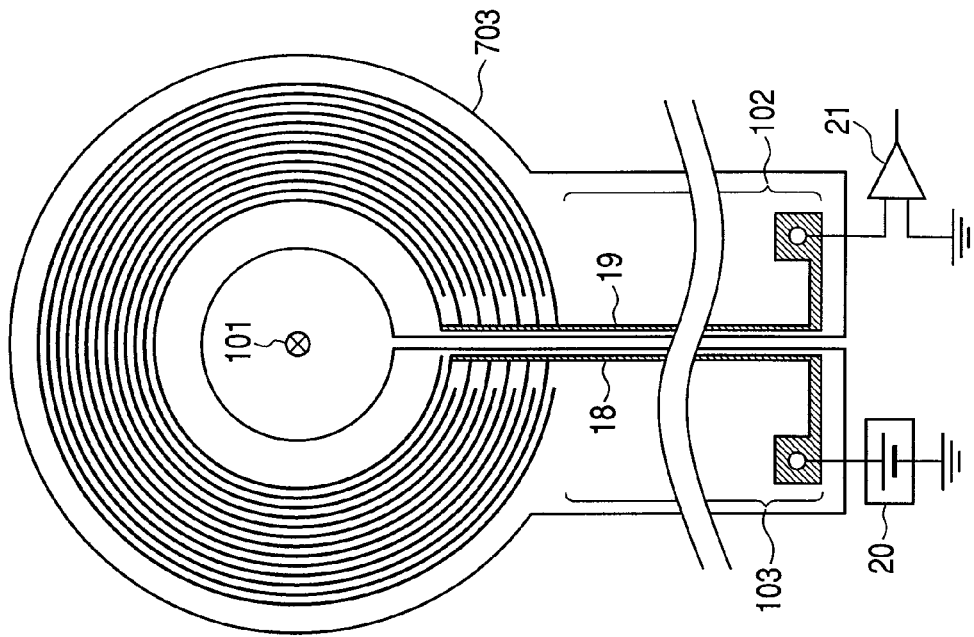
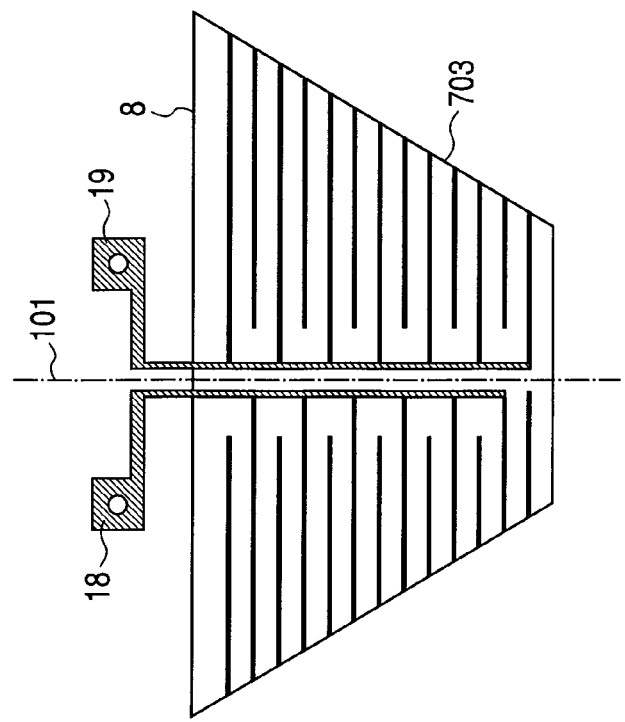
FIG. 13B
FIG. 13A

SCANNING ELECTRON MICROSCOPE

CLAIM OF PRIORITY

The present application claims priority from Japanese patent application JP 2008-064555 filed on Mar. 13, 2008, the content of which is hereby incorporated by reference into this application.

FIELD OF THE INVENTION

The present invention relates to a secondary electron detector, which is applied to a low vacuum (1 to several 1000 Pa) scanning electron microscope (Variable Pressure, VP-SEM) and a detecting method thereof. Specifically, the present invention relates to an apparatus and method that forms images by accelerating electrons, which are emitted from a sample and have information on an surface of the sample, due to an electric field supplied into the sample chamber, and amplifying (gas multiplication) the accelerated electrons by ionization scattering with gas molecules multiple times, and detecting a positive/negative displacement current flowing in a detection electrode by moving the amplified ions/electrons to the detection electrode.

BACKGROUND OF THE INVENTION

A VP-SEM, which uses gas multiplication, is an electron beam apparatus that detects secondary electrons emitted from a sample into a low vacuum atmosphere by irradiating primary electron beams to form image and is different from a general high vacuum SEM in view of the detection principle and the apparatus configuration.

Secondary electrons emitted from a sample by irradiating primary electron beams are accelerated due to an electric field and ionize the remaining gas molecules repeatedly. The electrons and ions are amplified (gas multiplication) and the amplified ions/electrons are detected by a detection electrode, thereby forming images. The ions/electrons are detected as a positive/negative displacement current that flows in the detection electrode. In order to move the generated ions/electrons to the detection electrode, any potential gradient is set between the detection electrode and a place where the ions/electrons are generate.

In order to describe a concept of the displacement current, FIG. 15 shows an equivalent circuit of the detector.

The equivalent circuit of the detector is represented by a condenser 901. Herein, it is considered when a capacitance C to which voltage V is applied and a charge q 902 within a condenser space having a distance L between the electrodes. The charge q moves in a direction perpendicular to the electrode by electric field V/L within the condenser space. At this time, if a fine movement amount is dx, the potential between the electrodes is changed by $d(=(V/L) \cdot q \cdot dx)$. In order to compensate for the changed amount in the potential, the charge dQ is induced in the condenser. The equilibrium equation of the potential is given as $d(=V \cdot dQ$ and its result is $dQ=(q/L) \cdot dx$. Since $I=dQ/dt$, $I=(q/L) \cdot v$. This is a displacement current 903. Herein, $v=dx/dt$ and is a velocity of the charge q.

Actually, the ions and electrons are mixed in the condenser by gas multiplication. At this time, the electrons move to a high potential electrode and the ions move to a low potential electrode, such that the displacement current flows in the same direction.

There are two detection methods, one is a method 904 that connects an electrode of a low voltage side, which is the detection electrode, to an amplification circuit to detect a positive displacement current and the other a method 905 that connects an electrode of a high voltage side, which is the detection electrode, to the amplification circuit to detect a negative displacement current. Although a physical principle of both methods is completely the same, the potential gradient supplied into the sample chamber or the shape of the electrode (electric field supplying electrode) for supplying the electric field, are different. Further, there are various detectors depending on the intended used.

Herein, it is noted that the charge moving in a vertical direction (vertical to an x-axis of FIG. 15) with respect to the electric field of the condenser is not detected as the displacement current. Further, it is noted that the response of the detector is determined based on the movement time of the ions whose movement is delayed. Generally, the movement time of ions is longer than the response time of the amplification circuit.

The inventors suggest scanning electron microscopes with the detector according to the method of detecting the positive displacement current. For example, JP-A-2001-126655 discloses a VP-SEM having a form that arranges a detection electrode on a sample holder and uses a secondary electron collector electrode (connected to the high-vacuum secondary electron detector) as an electric field supplying electrode arranged around an objective lens. The condenser space is formed between the electric field supplying electrode and the sample holder. Further, JP-A-2003-132830 discloses the VP-SEM having a form that can increase detection efficiency of current by disposing a detection electrode having a curved shape between an electric field supplying electrode and a sample holder (on a path generating the ionization scattering). Moreover, JP-A-2006-228586 discloses a configuration of a detection electrode enclosing the circumference of an electric field supplying electrode so as to shorten the movement time of the ions and increase the detection efficiency. In JP-A-2003-132830 and JP-A-2006-228586, the condenser space is formed between the electric field electrode and the detection electrode.

As the method of detecting the negative displacement current, there is G. D. Danilatos et al., Scanning 3, 215 (1980). The method uses both an electron current detecting electrode and an electric field supplying electrode, in which the potential of a surface of the detection electrode is maintained to be higher than that of the circumference of the detection electrode. The condenser space is formed between the electric field supplying electrode (detection electrode) and the sample holder. Further, JP-T-Hei9(1997)-501010 of Electro Scan Corporation suggests a detector that includes an electrode reducing a noise signal by the method of detecting the negative displacement current and as one embodiment, disclose an embodiment forming a configuration, which includes an electric field supplying electrode in a ring shape and an electrode that reduces a signal from a back scattered electron source or a noise signal from a primary electron beam source, on a print board. In this configuration, the condenser space is formed between the electric field supplying electrode (detection electrode) and the sample holder.

SUMMARY OF THE INVENTION

The arts described in the foregoing JP-A-2003-132830 and JP-T-Hei9(1997)-501010 requires a predetermined space within the sample chamber so that the detector can be arranged. Even though the JP-T-Hei9(1997)-501010 discloses the configuration where the detector on the substrate is capable of saving space; however, the entire thickness cannot be formed to several mm or less and if the detector is arranged just below the objective lens, it has a restriction in that a distance (working distance, WD) from the lower surface of the objective lens to the sample cannot be shorter than the thickness of the detector. Generally, it has been known that the shorter the WD, the higher the resolution of image becomes and it is preferable the thickness of the detector just below the objective lens is thinner.

Further, in the foregoing JP-A-2001-126655 and JP-T-Hei9(1997)-501010, the condenser space is a gap between the sample holder of the ground potential and the electric field supplying electrode to which the positive voltage is applied, but the response is delayed due to the time (several (seconds) required to move ions from the electric field supplying electrode to the sample standholder, and as a result the related arts are not applied to a high-speed scan mode (TV-Scan rate image) that acquires one sheet of images, for example, at about 0.033 seconds. Meanwhile, JP-A-2006-228586 can shorten the movement distance of ions and improves the response by disposing the detection electrode of the ground potential near the electric field supplying electrode, but when the condenser space is extended, the behavior of ions toward the sample holder is detected by the detection electrode, and as a result it is not applied to the TV-Scan rate image.

Further, in JP-A-2003-132830 and JP-T-Hei9(1997)-501010, the detector is configured by combining a plurality of parts, thus a predetermined cost is consumed to manufacture and assemble it.

It is an object of the present invention to provide a low-vacuum scanning electron microscope (VP-SEM) including a detector detecting secondary electrons, which can reduce space, achieve a high-speed response, and reduce costs.

In the present invention, a method, which amplifies electrons by gas multiplication and detects an displacement current flowing in a detection electrode by moving the amplified charged particles within electric field, is applied to a low-vacuum scanning electron microscope (VP-SEM) and the above objects can be achieved by forming an electric field supplying electrode having a positive potential that supplies the electric field for the gas multiplication and a ground electrode having potential (typically, ground potential) lower than that of the electric field supplying electrode on a substrate.

Further, the substrate on which the electrodes are formed is preferably configured of a substrate having flexibility. The flexibility described herein preferably has property that the shape and function are not changed even when hitting a cylinder having a diameter of about 10 mm, bending it to 90° and then recovering it into an original state.

Moreover, although the specification discloses the method that amplifies and detects the positive displacement current by connecting the ground electrode as the detection electrode to the amplification circuit, it may be permitted to detect the negative displacement current by connecting the electric field supplying electrode as the detection electrode to the floating amplification circuit.

With the configuration of the present invention, the gas multiplication of the secondary electrons and the detection of the displacement current can be performed by one sheet of the detector while saving cost and space, making it possible to improve the response. Further, the assembly is more facilitated by forming a thin film type detector on the substrate having flexibility, making it possible to reduce the costs.

BRIEF DESCRIPTION OF THE DRAWINGS

FIG. 2A is a diagram showing a configuration example of an on axial secondary electron detector according to the first embodiment;

FIG. 2B is a diagram showing a configuration example of the on axial secondary electron detector and a back scattered electron detector according to the first embodiment;

FIG. 3A is a diagram showing a configuration example of an on axial secondary electron detector according to a second embodiment;

FIG. 3B is a diagram showing a configuration example of the on axial secondary electron detector and a back scattered electron detector according to the second embodiment;

FIG. 5 is a diagram showing a configuration example of an on axial secondary electron detector according to a fourth embodiment;

FIG. 9A is a diagram showing a configuration example (first example) of an off axial secondary electron detector according to the seventh embodiment;

FIG. 9B is a diagram showing a configuration example (second example) of the off axial secondary electron detector according to the seventh embodiment;

FIG. 13A is a diagram showing a configuration example of the scanning electron microscope where the arrangement position of the detector according to the ninth embodiment is an outer surface of the objective lens;

FIG. 13B is a diagram showing a configuration example of the scanning electron microscope where the arrangement position of the detector according to the ninth embodiment is an outer surface of the objective lens;

DETAILED DESCRIPTION OF THE PREFERRED EMBODIMENTS

Hereinafter, although a representative embodiment of the present invention will be described with reference to the accompanying drawings, first, a basic configuration and effect of a detector according to the present invention will be described.

Figure 16:
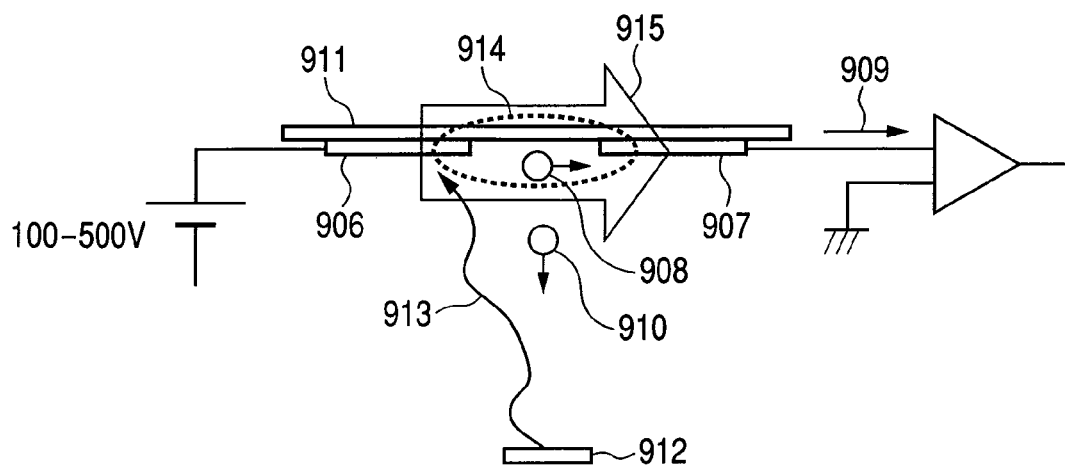
FIG. 16 is a diagram for explaining how a high-speed response can be achieved by the detector of the present invention.

In FIG. 16, an electric field supplying electrode 906 and a detection electrode 907 are formed on a thin film type substrate 911 having flexibility, for example, a high-resistance polyimide film, and the like, by using an etching method, etc., such that a detector is configured in a thin film type, making it possible to reduce a space. Further, it can be mass produced by having the same configuration, making it possible to reduce manufacturing cost, and as a result, it does not need an assembly process, making it possible to reduce assembly cost.

The entire detector is arranged so that it is vertical with respect to an orbit of a secondary electron 913 generated from a sample 912 as shown in FIG. 16. A positive voltage is applied to the electric field supplying electrode 906. The detection electrode 907 is typically maintained at a ground potential and is wire-connected with an amplification circuit. With the arrangement, a condenser space 914 is formed between the electric field supplying electrode 906 and the detection electrode 907 and a condenser electric field 915 is horizontally formed to a surface of the detector. As a result, among ions generated by gas multiplication induced near the electric field supplying electrode 906, a movement of an ion 908, which moves in a horizontal direction with respect to the surface of the detector, is detected as a displacement current 909 from the detection electrode 907. Even though a condenser space moves along a potential gradient, since electrode gap is short, the ion 908, which moves in the horizontal direction, moves up to the detection electrode 907 within a short time. Therefore, a high-speed response can be realized. Meanwhile, if the movement distance of ion is long, the response is delayed at the time of detecting the ion, but an ion 910 returned to a sample holder on which the sample 912 is mounted vertically moves with respect to the condenser electrode, such that it is not detected in the arrangement of the present detector. Thereby, the response can be improved.

First Embodiment

In a first embodiment, in a scanning electron microscope including a secondary electron detector formed on a flexible thin film type substrate as described above, the secondary electron detector that is arranged near an irradiation optical axis of a primary electron beam, that is, an on axial secondary electron detector will be described with respect to a first embodiment.

Figure 1:
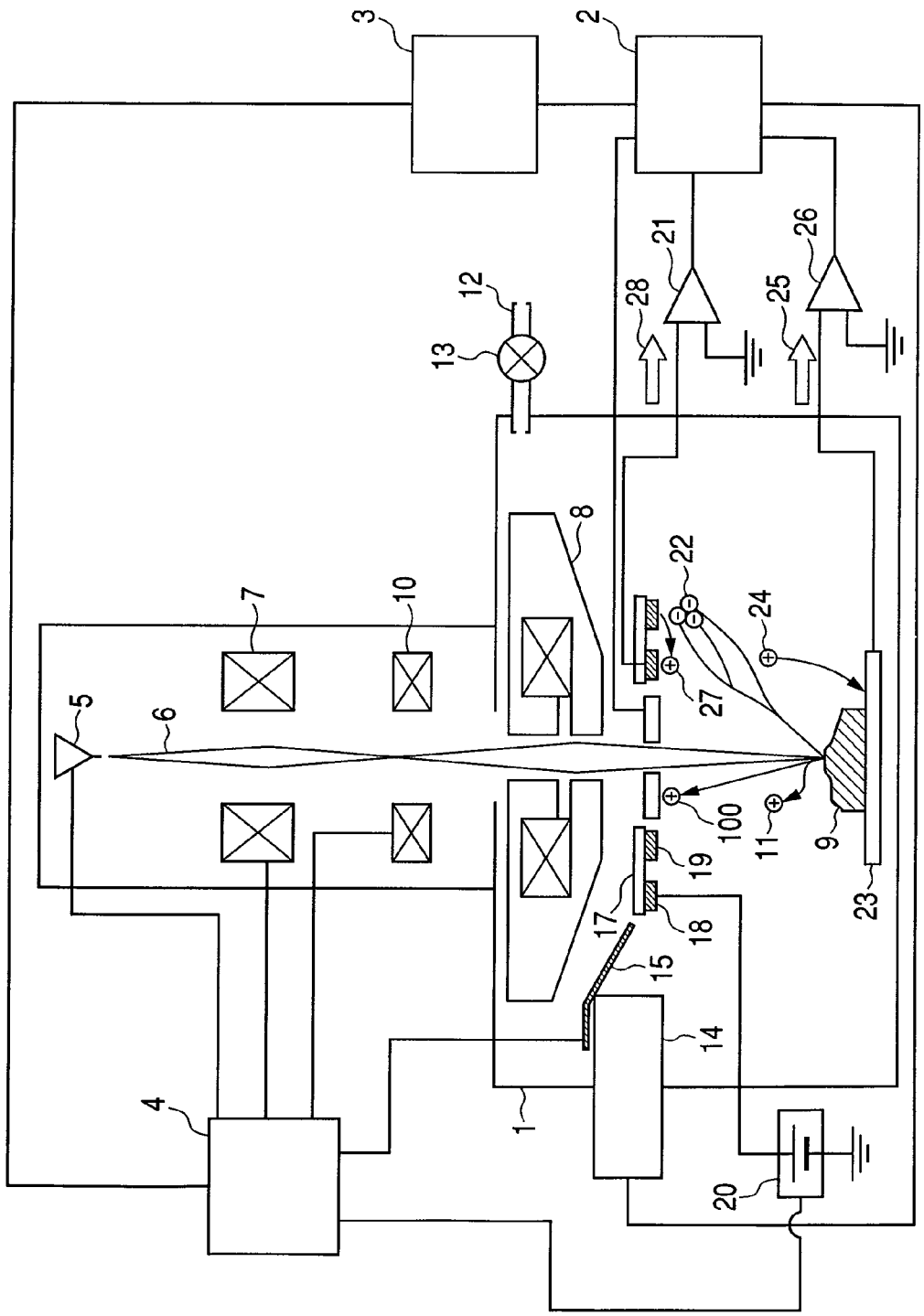
FIG. 1 is a diagram showing a configuration example of a scanning electron microscope according to a first embodiment relating to an installation position of a detector.

FIG. 1 schematically shows an outer appearance configuration of a scanning electron microscope in a type where an on axial secondary electron detector is arranged. The scanning electron microscope shown in FIG. 1 includes an electron optical lens tube including an objective lens 8, a sample chamber 1, an information processor 2 that performs a signal process on a positive current signal inducing a detected secondary electron and forms an image, and an image processing terminal 3 that is connected to the image processor, etc. The image processing terminal 3 includes a display unit that displays a formation image or an information input unit that inputs information required to operate an apparatus for a GUI displayed by the display unit, and the like. Further, the desired values of each component within the electron optical lens tube, for example, an acceleration voltage of a primary electron beam, current and voltage applied to each electrode, etc., are input on an image processing terminal 3 automatically or by a user and are controlled by an observation condition controlling unit 4.

An electron gun 5 received inside the lens tube of the scanning electron microscope is configured using a tungsten heat electron gun and typically generates the primary electron beam 6 having energy of 0.5 to 30 keV. A condenser lens 7 has an action that focuses the primary electron beam 6 and sets the primary electron beam 6 so as to meet the optical conditions suitable for the SEM observation. The objective lens 8 has also an action that focuses the primary electron beam 6 and focuses the primary electron beam 6 in an observation object portion on the sample 9. A bottom surface of the objective lens 8 configures a bottom surface of the electron optical lens tube. A deflector 10 scans an irradiation position of the primary electron beam 6 on the sample 9 according to a desired observation viewing range. A secondary electron 11 and a back scattered electron 100 are generated from the sample according to the irradiation of the primary electron beam 6.

A vacuum degree inside the sample chamber 1 in which the sample 9 is collected is controlled by opening and closing a needle valve 13 of an atmosphere inlet 12 to the sample chamber 1. The VP-SEM includes an observation mode under a high vacuum in addition to an observation mode under a low vacuum, closes the needle valve 13 at the time of the observation under high vacuum, and maintains the inside of the sample chamber 1 at a high vacuum state of $10^{-3}$ Pa or less. At this time, the secondary electron 11 generated from the sample 9 is detected in the secondary electron detector for high vacuum. In the first embodiment, as the secondary electron detector for high vacuum, an Everhart Thornley type detector 14, which includes a scintillator and a photomultiplier, is used. At this time, in order to increase the collection efficiency of the secondary electron 11, the potential gradient is supplied within the sample chamber 1 by the secondary electron collector electrode 15 that typically applies +300 V.

The back scattered electron 100 is detected by the back scattered electron detector 16 that is installed just below the objective lens 8. The back scattered electron detector 16 uses a semiconductor detector or a micro channel plate. In the case of using the semiconductor detector, the back scattered electron can be also detected even in the observation mode under low vacuum, to be described below. Hereinafter, assume that the back scattered electron detector 16 is the semiconductor detector.

After the detected secondary electron and the signal due to the back scattered electron are electrically amplified, they are A/D converted in the image processor 2, synchronized with the scanning of the primary electron beam 6, and displayed on the image processing terminal 3. The SEM image in the observation viewing range is obtained.

The inside of the sample chamber 1 is maintained at a gas pressure of 1 to several 1000 Pa by opening and closing the needle valve 12 at the time of observing under low vacuum. The potential of the secondary electron collector electrode 15 is switched into the ground potential. The gas pressure inside the typical sample chamber is 1 to 300 Pa.

A holder (not shown), which is fixed to the objective lens or an inner wall of the sample chamber, is arranged just below the objective lens 8 so that it is horizontal to the sample surface and the on axial secondary electron detector 17 is attached to the holder. The secondary electron detector 17 has a circular thin film type whose central hole is installed so that a detection solid angle of the back scattered electron detector 16 is not damaged, the center thereof conforms to the optical axis of the primary electron beam 6, and is horizontally arranged to the sample surface. The arrangement position of the secondary electron detector 17 is the sample side rather than the lower surface of the objective lens and the electron gun side rather than the lower surface of the back scattered electron detector 16. This is to allow the secondary electron detector 17 not to limit the WD.

The secondary electron detector 17 has a shape where the electron supplying electrode 18 and the detection electrode 19 formed by an etching method, and the like is arranged on a film having a thickness of 100 µm or less of polyimide, etc., and its entire thickness is formed to be 100 µm or less. The electric field supplying electrode 18 is typically applied with the positive voltage of 100500 V by a power supply 20 and the detection electrode 19 is typically maintained at the ground potential and is wire-connected with an amplification circuit A 21 for amplifying the displacement current.

The secondary electron 11 having energy of about several eV emitted from the sample 9 is accelerated according to the electric field supplying from the electric field supplying electrode 18 to the sample chamber. In this process, the gas multiplication is generated due to the interaction with gas within the sample chamber and the electrons and ions are amplified near the electric field supplying electrode 18. An electron 22 from the amplified secondary electron source moves toward the electric field supplying electrode 18. The amplified ion mainly plots two orbits. An ion 24 moving toward the sample holder 23 moves in the condenser space formed between the electric field supplying electrode 18 and the sample holder 23 and an displacement current 25 generated by the ion 24 flows in the sample holder 23. In the first embodiment, in order to detect the displacement current 25, the amplification circuit B 26 is wire-connected with the sample holder. Meanwhile, an ion 27 moving toward the detection electrode 19 moves in the condenser space formed between the electric field supplying electrode 18 and the detection electrode 19. Due to the movement of the ion 27, a displacement current 28 generated by the ion 27 flows in the detection electrode 19.

The amplification circuits 21 and 26 amplify the displacement current at a desired gain. The amplified signal is A/D converted in the image processor 2, synchronized with the scanning of the primary electron beam 6, and displayed on the image processing terminal 3. Thereby, the secondary electron SEM image in the observation viewing range is obtained based on the scanning range of the primary electron beam 6.

Thus, the signal detected from the detection electrode 19 responds fast due to the foregoing reason and if this signal is used, a good quality of image can be obtained without causing the distortion of the image even in a TV-Scan image (0.033 s/frame) where the scanning speed is fast. In an observation that focuses on the yield of the signal, the scanning speed is typically delayed by 10 seconds or more per one image drawing and the displacement current signal detected from the sample holder 23 is electrically added in the image processor 2 and displayed on the image processing terminal 3. Further, if there is no a need to detect the displacement current 26 from the sample holder 23, the amplification circuit 26 may also not be needed.

The voltage applied to the needle valve 13 controlling the gas pressure and each electrode set to the conditions suitable for the observation conditions by the observation condition controlling unit 4. Further, the gas pressure and the voltage applied to the electric field supplying electrode 18 may be set to a desired setting value from the GUI on the image processing terminal 3 by the user.

FIG. 2A shows a pattern diagram of the on axial secondary electron detector 17 of FIG. 1 viewed from a sample direction. The detection electrode 19 has a doughnut shape using an optical axis 101 as a center and typically has a width of about 0.110 mm. There is the electric field supplying electrode 18 in the doughnut shape that typically has a width of 0.110 mm in the outside of the detection electrode 19. Each gap is typically about 0.110 mm and is isolated from each other. Each electrode includes lead portions 102 and 103 for wire connection and can be wire-connected at a place sufficiently spaced from the optical axis 101 and can be wire-connected. Any of the detection electrode 19 and the electric field supplying electrode 18 is formed on a substrate 104 of polyimide, etc., by an etching method and the thickness including the electrode is typically 100 µm or less. The center of the substrate 104 is provided with a hole 105 (a hatch portion of FIG. 2A) for passing through the primary electron beam not to prevent the primary electrode beam from passing. The diameter of the hole 105 may be increased to have the same size as the inner diameter of the detection electrode 19 in order to avoid the charging of the substrate by electrons emitted from the sample. As in the first embodiment of the installation position of the detector, when being simultaneously used with the semiconductor detector (16 of FIG. 1), the diameter of the hole 105 should be larger than a felt area of the semiconductor detector so that the emitted electron reaches the semiconductor detector. When not being simultaneously with the semiconductor detector, the diameter of the hole 105 and the inner diameter of the detection electrode 19 may be decreased to about 0.5 mm so that it does not interfere with the primary electron beam at the minimum. Further, the inside electrode is not necessarily the detection electrode. The wire connection of the power supply 20 and the amplifier 21 is exchanged so that their role may be exchanged. In this case, the electrode 19 of FIG. 2A becomes the electric field supplying electrode and the electrode 18 becomes the detection electrode. The surface of the substrate 14 may be coated with a material having a limited resistance in order to avoid the charging. Moreover, the portion other than the electrode portion of the substrate 14 may be cut out in order to avoid the charging.

FIG. 2B is a pattern diagram showing a positional relationship between the on axial secondary electron detector 17 and the semiconductor detector 16. By such an arrangement, the secondary electron detector 17 can be arranged without interfering with the felt area of the semiconductor detector.

Second Embodiment

FIG. 3A shows another embodiment of the on axial secondary electron detector. The configuration other than the secondary electron detector is the same as the first embodiment. FIG. 3A is a pattern diagram showing the detector viewed from the sample direction. In the configuration of the electrode, the electric field supplying electrode 18 and the detection electrode 19 have a fan shape rather than a circular shape as compared to the first embodiment of the on axial secondary electron detector and a substrate 201 has a shape where a portion of the circle is chipped as compared to the substrate 14. As described above, there is an effect that the secondary electron detector does not shield the path of other detectors arranged at an off-axis such as an EDX detector and a high-vacuum secondary electron detector and the like and the sample by installing an area which does not include the substrate or the electrode. Further, even though the sample holder is inclined, the interference of the detector and the sample holder can be avoided.

FIG. 3B is a pattern diagram showing a case where both the secondary electron detection and the semiconductor detector 16 are used. The secondary electron detector can be arranged without interfering with the felt area of the semiconductor detector by the above-mentioned arrangement.

The method of forming the secondary electron image and the exchange of the role of the electric field supplying electrode and the detection electrode, which are shown in FIGS. 3A and 3B, are the same as the first embodiment shown in FIGS. 2A and 2B.

Third Embodiment

Figure 4:
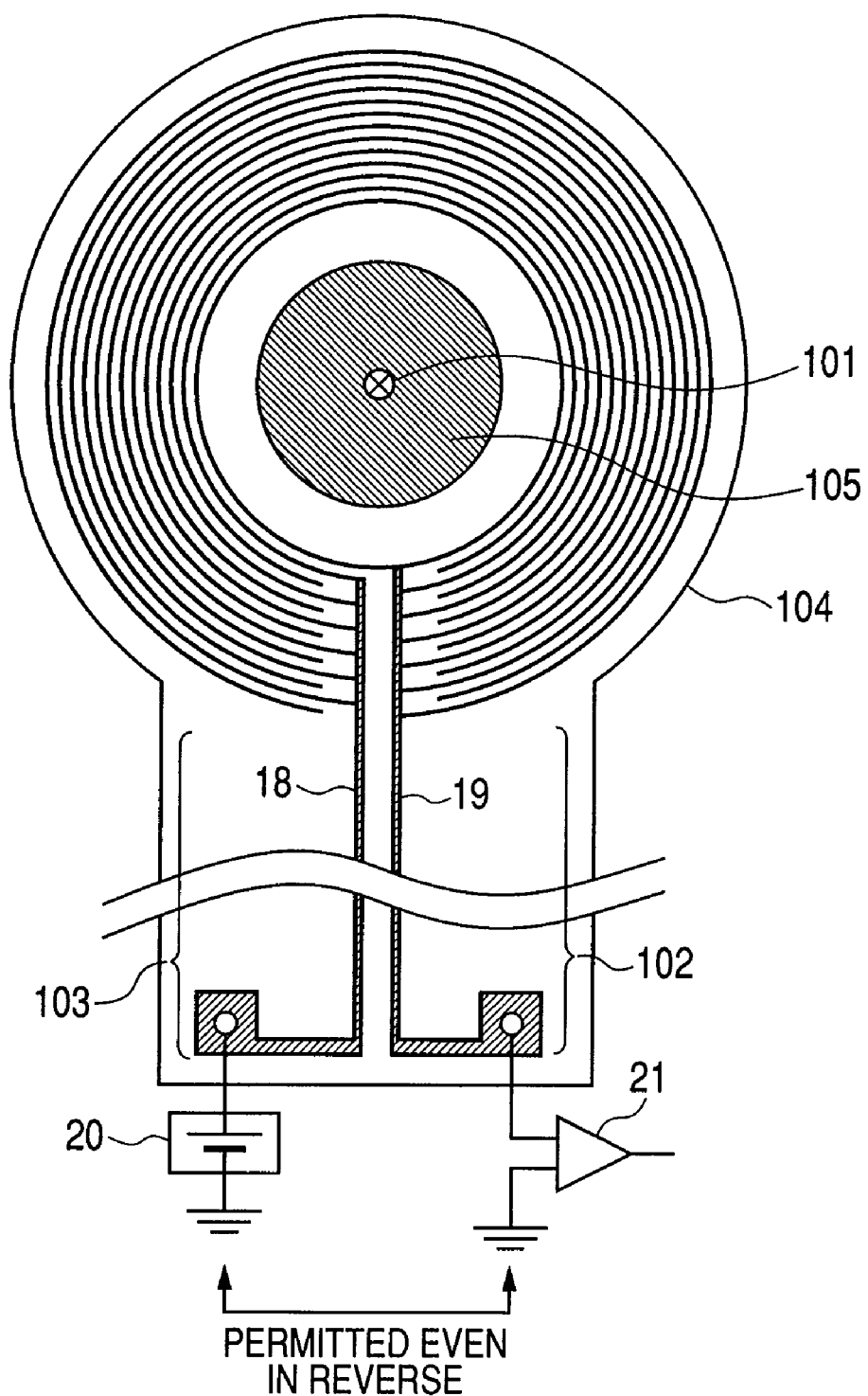
FIG. 4 is a diagram showing a configuration example of an on axial secondary electron detector according to a third embodiment.

FIG. 4 shows a third embodiment of the on axial secondary electron detector. The configuration other than the secondary electron detector is the same as the first embodiment. FIG. 4 is a pattern diagram showing the detector viewed from the sample direction. In the electrode configuration of the third embodiment, the electric field supplying electrode 18 and the detection electrode 19 are shaped as a plurality of concentric doughnut types and alternately arranged to each other. As described above, an area, which amplifies the secondary electron, can be extended by forming pairs of the plurality of electric field supplying electrodes and the detection electrodes as compared to the first embodiment of the on axial secondary electron detector, the electron amplified therein moves to the outside thereof and can be amplified, the effect of the high-yield detection can be obtained. Further, even in the present configuration, the configuration of the fan shape of the second embodiment can be achieved. The method of forming the secondary electron image and the exchange of the role of the electric field supplying electrode and the detection electrode are the same as the first embodiment.

Fourth Embodiment

FIG. 5 shows a fourth embodiment of the on axial secondary electron detector. The configuration other than the secondary electron detector is the same as the first embodiment. FIG. 5 is a pattern diagram showing the detector viewed from the sample direction. In the electrode configuration, the electric field supplying electrode 18 and the detection electrode 19 are characteristically unique in view of shape. By the above-mentioned configuration, similarly to the third embodiment of FIG. 4 of the on axial secondary electron detector, the area, which amplifies the secondary electron, can be extended and the effect of the high-yield detector can be obtained. Further, even in the present configuration, the configuration of the fan shape of the second embodiment can be achieved. The method of forming the secondary electron image and the exchange of a role of the electric field supplying electrode and the detection electrode are the same as the first embodiment.

Fifth Embodiment

Figure 6A:
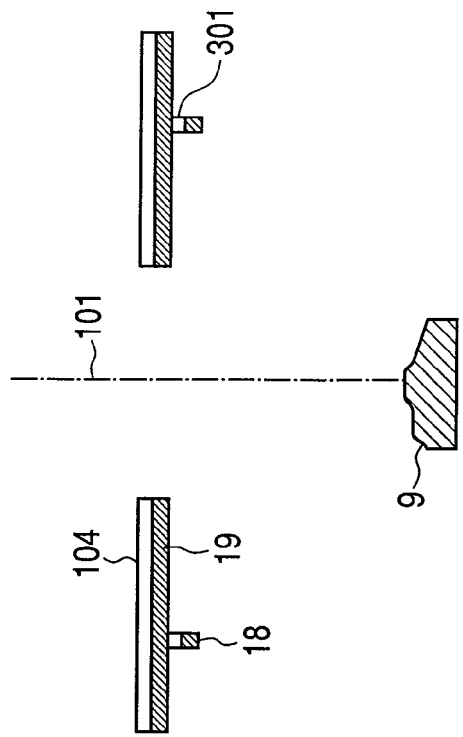
FIG. 6A is a plan view showing a configuration example of an on axial secondary electron detector according to a fifth embodiment.
Figure 6B:
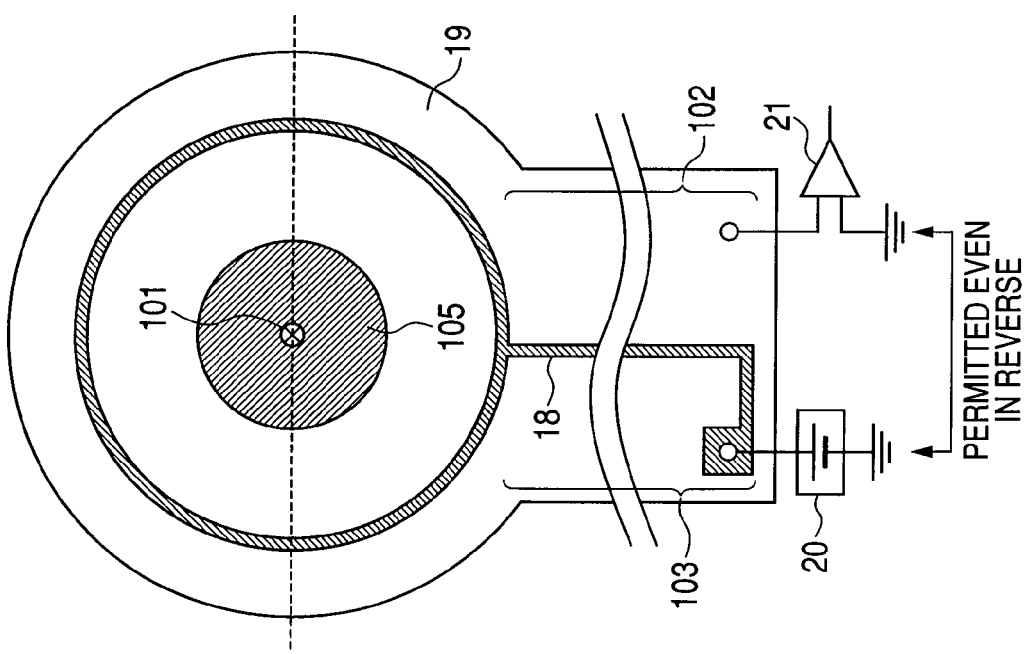
FIG. 6B is a cross-sectional view showing a configuration example of the on axial secondary electron detector according to the fifth embodiment.

FIGS. 6A and 6B show a fifth embodiment of the on axial secondary electron detector. The configuration other than the secondary electron detector is the same as the first embodiment. FIG. 6A is a pattern diagram showing the detector viewed from the sample direction. FIG. 6B is a cross-sectional view of a dotted-line portion of FIG. 6A. In the present configuration, two electrodes maintained at different voltage in the detector are arranged in a layer shape in a vertical direction to the substrate surface via a thin film type insulator.

In detail, the electrode configuration has a two-layer structure and a surface (lower surface) of the sample 9 side of the thin film type substrate 104 is formed with the detection electrode 19, the lower surface of the detection electrode 19 is formed with a thin film 301 of the insulator, and the lower surface of the thin film 301 of the insulator is formed with the electric field supplying electrode 18. In the present embodiment, the shape of the electric field supplying electrode 18 is the same as the first embodiment 1 (FIG. 2) but is not limited thereto. For example, the shape of the electric field supplying electrode 18 may be the same as the electric field supplying electrode or the detection electrode of the second and fourth embodiments (FIGS. 3A and 3B and 5). By the above-mentioned configuration, the thin film type substrate 104 of the insulator cannot be seen from the sample and thus, an effect, which suppresses the charging of the detector due to the impact of the emitted electron from the sample, can be obtained. Further, even in the present configuration, the configuration of the fan shape of the second embodiment can be achieved. The method of forming the secondary electron image and the exchange of a role of the electric field supplying electrode and the detection electrode are the same as those in the first embodiment.

Sixth Embodiment

Figure 7A:
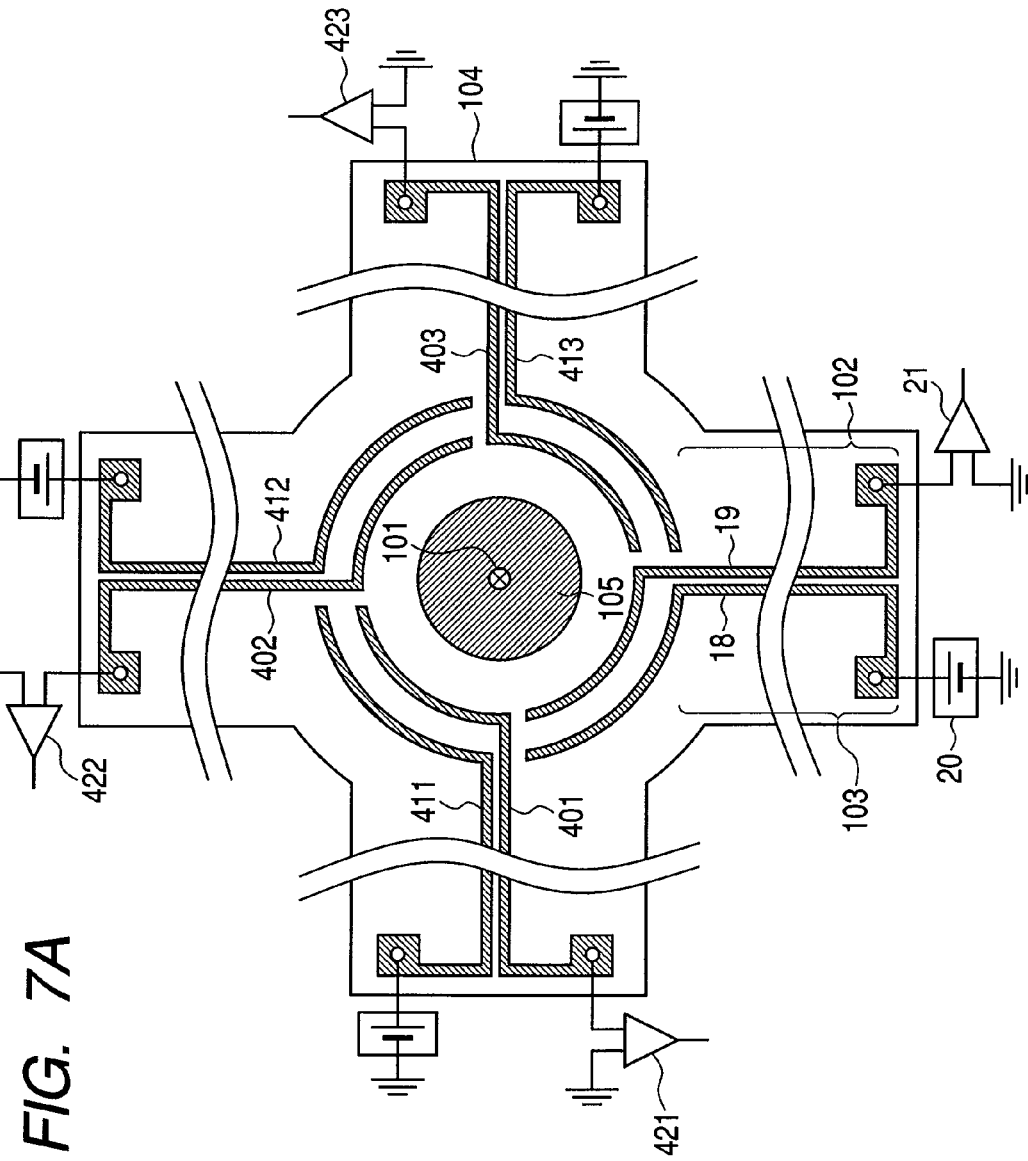
FIG. 7A is a diagram showing a configuration example (first example) of an on axial secondary electron detector according to a sixth embodiment.
Figure 7B:
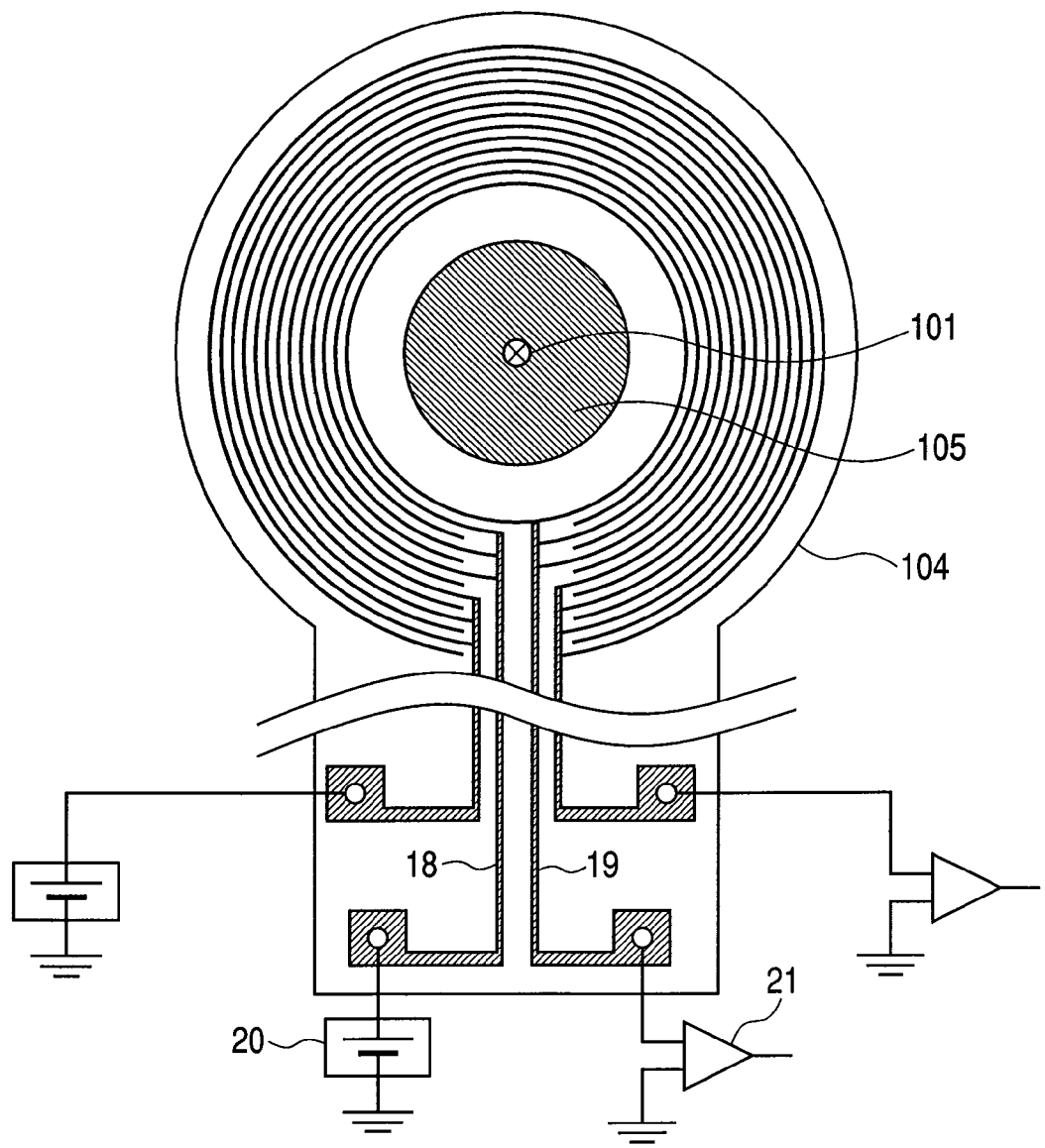
FIG. 7B is a diagram showing a configuration example (second example) of an on axial secondary electron detector according to the sixth embodiment.

FIGS. 7A and 7B show another embodiment of the on axial secondary electron detector. The configuration other than the secondary electron detector is the same as that in the first embodiment.

In the configuration of FIG. 7A, the detection electrodes 19, 401, 402, and 403 and the electric field supplying electrodes 18, 411, 412, and 413 are segmented into a plural number. The signals from the segmented detection electrodes may be amplified by the amplification circuits 21, 421, 422, and 423 of another system. By the above-mentioned configuration, an effect, which can differentiate and detect the signals detected by an azimuth angle of the secondary electrode emitted from the sample, can be obtained. FIG. 7A shows an embodiment corresponding to a case where they are segmented into four azimuths, but they may be segmented into other azimuths.

Further, in the configuration of FIG. 7B is a configuration that forms a two-system detector on the substrate 104 in the inside and outside. By the above-mentioned configuration, an effect, which can differentiate and detect the signals detected by an elevation angle of the secondary electron emitted, can be obtained. The shape of the electric field supplying electrode or the detection electrode may be the same as the electric field supplying electrode or the detection electrode of the first, third, fourth and fifth embodiments (FIGS. 2A, 2B, 4, 5, 6A, and 6B). The method of forming the secondary electron image of each segmented device and the exchange of the role of the electric field supplying electrode and the detection electrode are the same as those in the first embodiment.

Seventh Embodiment

In the seventh embodiment, in the scanning electrode microscope including the secondary electron detector formed on the flexible thin film type substrate, the secondary electron detector that is arranged outside an irradiation optical axis of a primary electron beam, that is, an off axial secondary electron detector will be described with respect to a seventh first embodiment.

Figure 8:
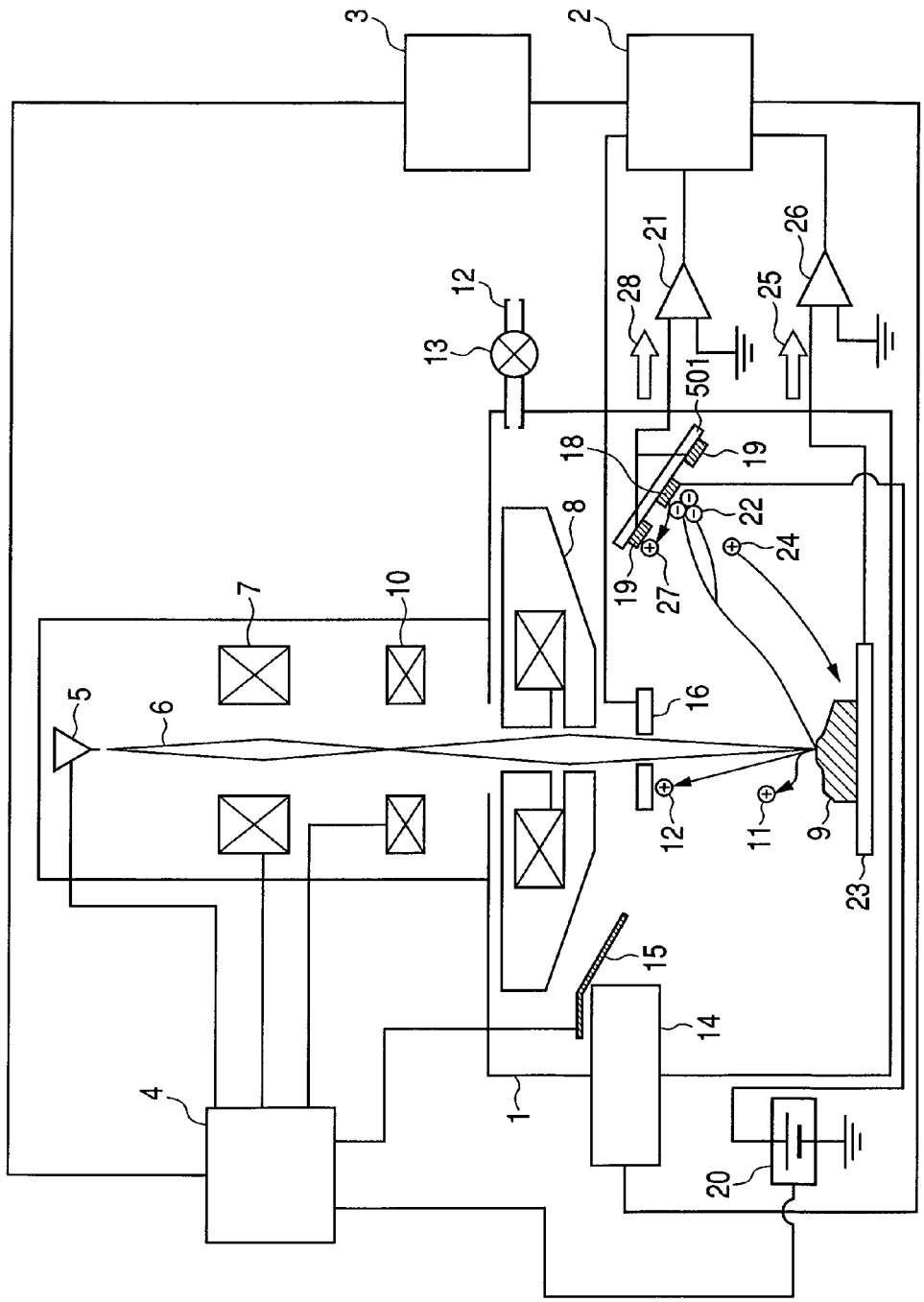
FIG. 8 is a diagram showing a configuration example of a scanning electron microscope according to a seventh embodiment relating to an installation position of a detector.

FIG. 8 shows a pattern diagram of the sample chamber configuration of the scanning electron microscope in a type where the off axial secondary electron detector is arranged. The configuration other than the secondary electron detector is the same as the first embodiment. The configuration to the electron gun from the sample chamber is the same as that in the first embodiment.

In the seventh embodiment, an off axial secondary electron detector 501 is attached on a holder (not shown) of the off-axis that is fixed to the sample chamber 1 or the objective lens 8. The surface of the holder may be flat. Further, the surface of the holder may be bent so that a distance from any point on the surface of the holder to the sample is constant. By the above-mentioned configuration, an effect, which avoids the interference with other detectors installed near the surface of the sample or the interference with the sample holder of a case where the sample holder is inclined, can be obtained.

FIGS. 9A and 9B show pattern diagrams of the off axial secondary electron detector 501 of FIG. 8 viewed from the sample direction. The configuration other than the secondary electron detector is the same as the first embodiment. FIG. 9A shows one type of the electric field supplying electrode 18 and FIG. 9B shows the enlarged electric field supplying electrode 18 and detection electrode 19 in order to enlarge the detection area. The electric field supplying electrode 18 typically has a width of about 0.110 mm and the detection electrode 19 typically has a width of about 0.110 mm. Each electrode is typically arranged like a comb with a gap of about 0.110 mm. Any of the detection electrode 19 and the electric field supplying electrode 19 is formed on a substrate 601 of a polyimide film, etc., by an etching method, and the like and the thickness, including the electrode, is typically 100 µm or less. Further, the inside electrode is not necessarily the electric field supplying electrode and the wire connection of the amplifier 21 and the power supply 20 is exchanged, so that their role may be exchanged. The method of forming the secondary electron image and the exchange of a role of the electric field supplying electrode and the detection electrode are the same as those in the first embodiment.

Eighth Embodiment

Figure 10A:
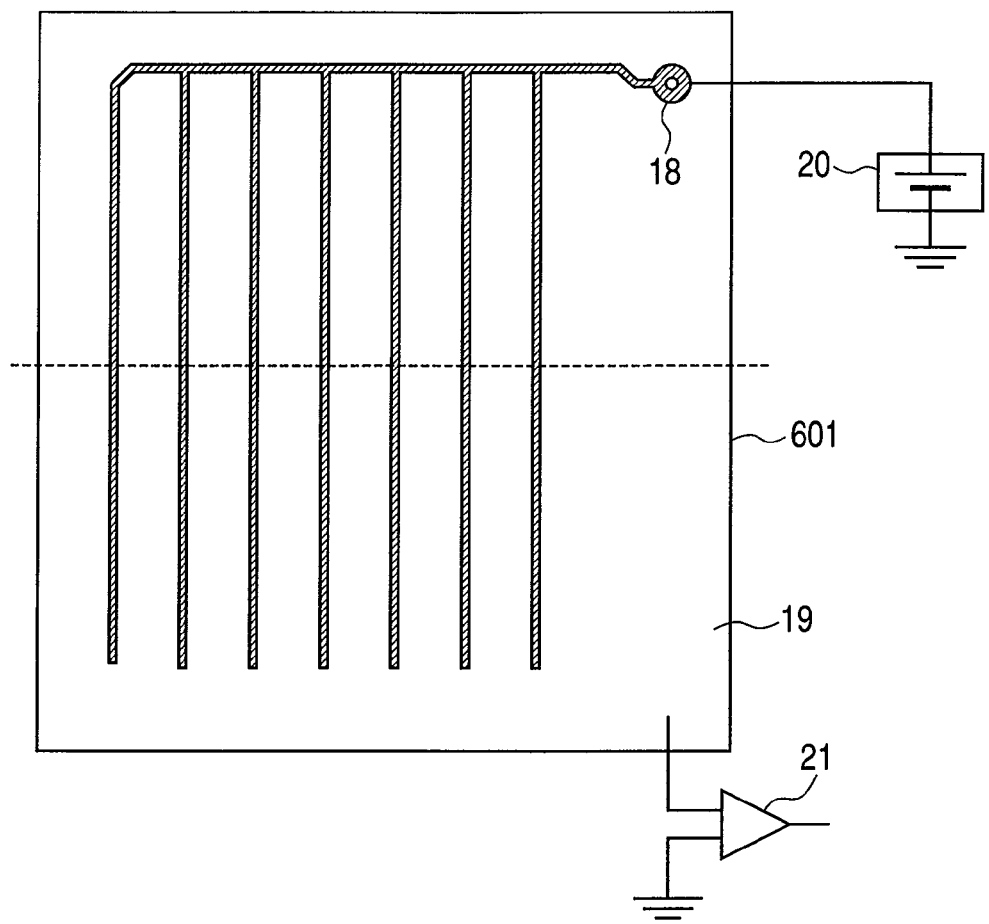
FIG. 10A is a plan view showing a configuration example of an off axial secondary electron detector according to an eighth embodiment.
Figure 10B:
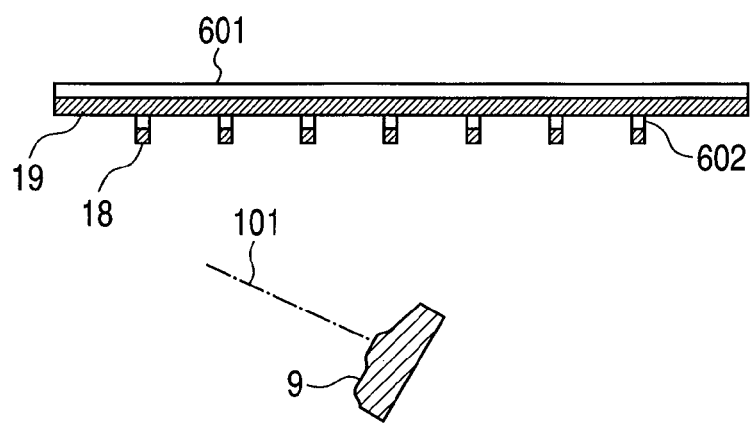
FIG. 10B is a cross-sectional view showing a configuration example of an off axial secondary electron detector according to the eighth embodiment.

FIGS. 10A and 10B show another embodiment of the off axial secondary electron detector. The configuration other than the secondary electron detector is the same as that in the first embodiment. FIG. 10A shows a pattern diagram of the detector viewed from the sample direction. FIG. 10B is a cross-sectional view of a dotted-line portion of FIG. 10A. In the configuration of the eighth embodiment, two electrodes maintained at different voltage in the detector are arranged in a layer shape in a vertical direction to the substrate surface via the thin film type insulator.

In detail, the electrode configuration has a two-layer structure and a surface (lower surface) of the sample side of the thin film type substrate 601 is formed with the detection electrode 19, the lower surface of the detection electrode 19 is formed with a thin film 602 of the insulator, and the lower surface of the thin film 602 of the insulator is formed with the electric field supplying electrode 18. The shape of the electric field supplying electrode 18 is the same as that of the electric field supplying electrode of the embodiment shown in FIG. 9B of the off axial secondary electron detector.

By the above-mentioned configuration, the thin film type substrate of the insulator cannot be seen from the sample and thus, an effect, which suppresses the charging of the detector due to the impact of the emitted electron from the sample, can be obtained. The method of forming the secondary electron image and the exchange of a role of the electric field supplying electrode and the detection electrode are the same as those in the first embodiment.

Ninth Embodiment

In the ninth embodiment, in the scanning electron microscope including the secondary electron detector formed on the flexible thin film type substrate, the secondary electron detector having a shape where the secondary electron detector is attached to the surface of the structure within the sample chamber will be described with respect to the ninth embodiment.

Figure 11:
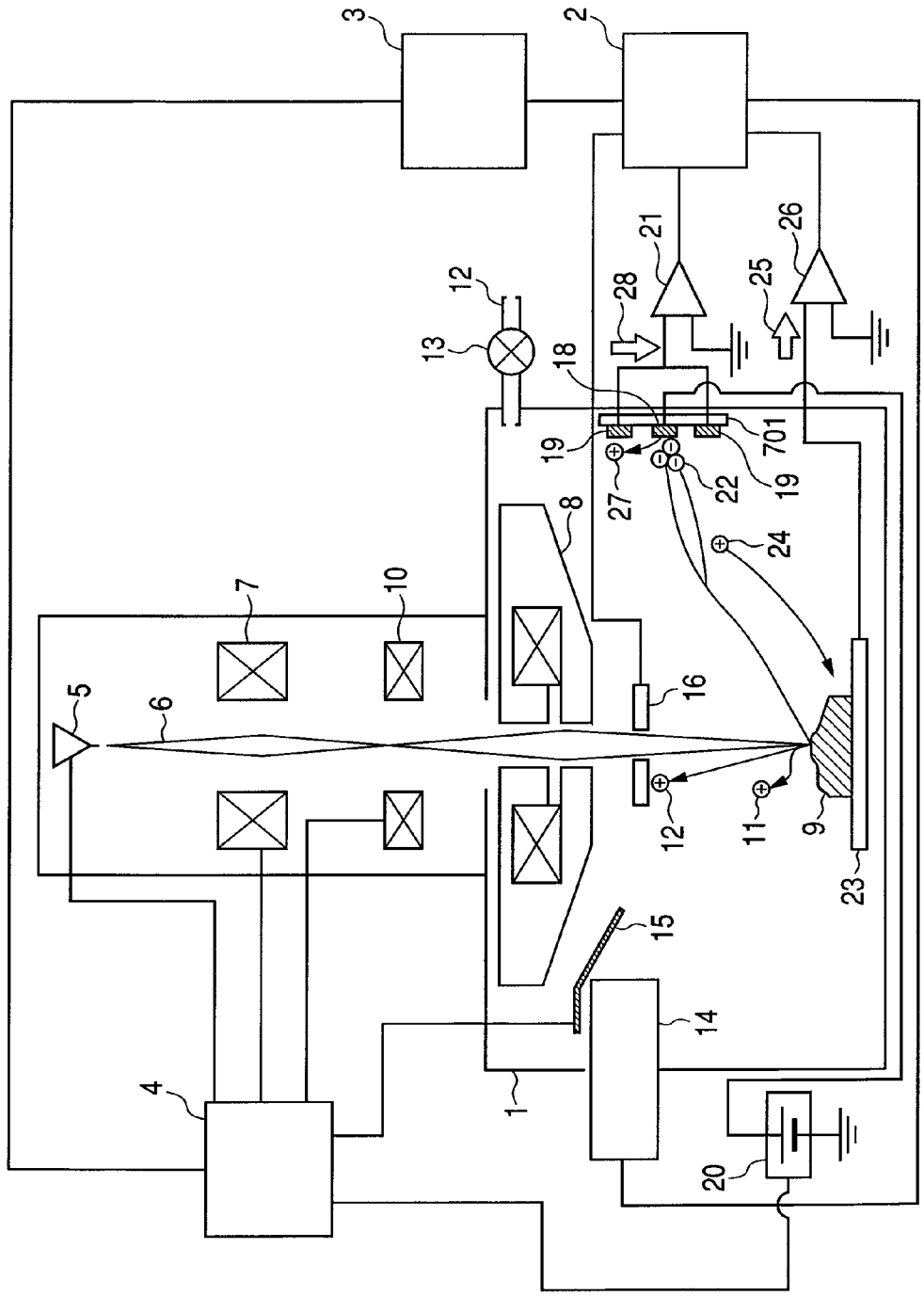
FIG. 11 is a diagram showing a configuration example of a scanning electron microscope where an arrangement position of a detector according to a ninth embodiment relating to an installation position of the detector is an inner wall of a sample chamber.

FIG. 11 schematically shows a ninth embodiment of the scanning electron microscope in a shape where a detector 701 having the same shape as the seventh embodiment shown in FIGS. 9A and 9B is attached to an inner wall of the sample chamber 1. By the above-mentioned configuration, the inner wall of the sample chamber, which is an original dead space, can be used as the holder of the secondary electron detector.

Figure 12:
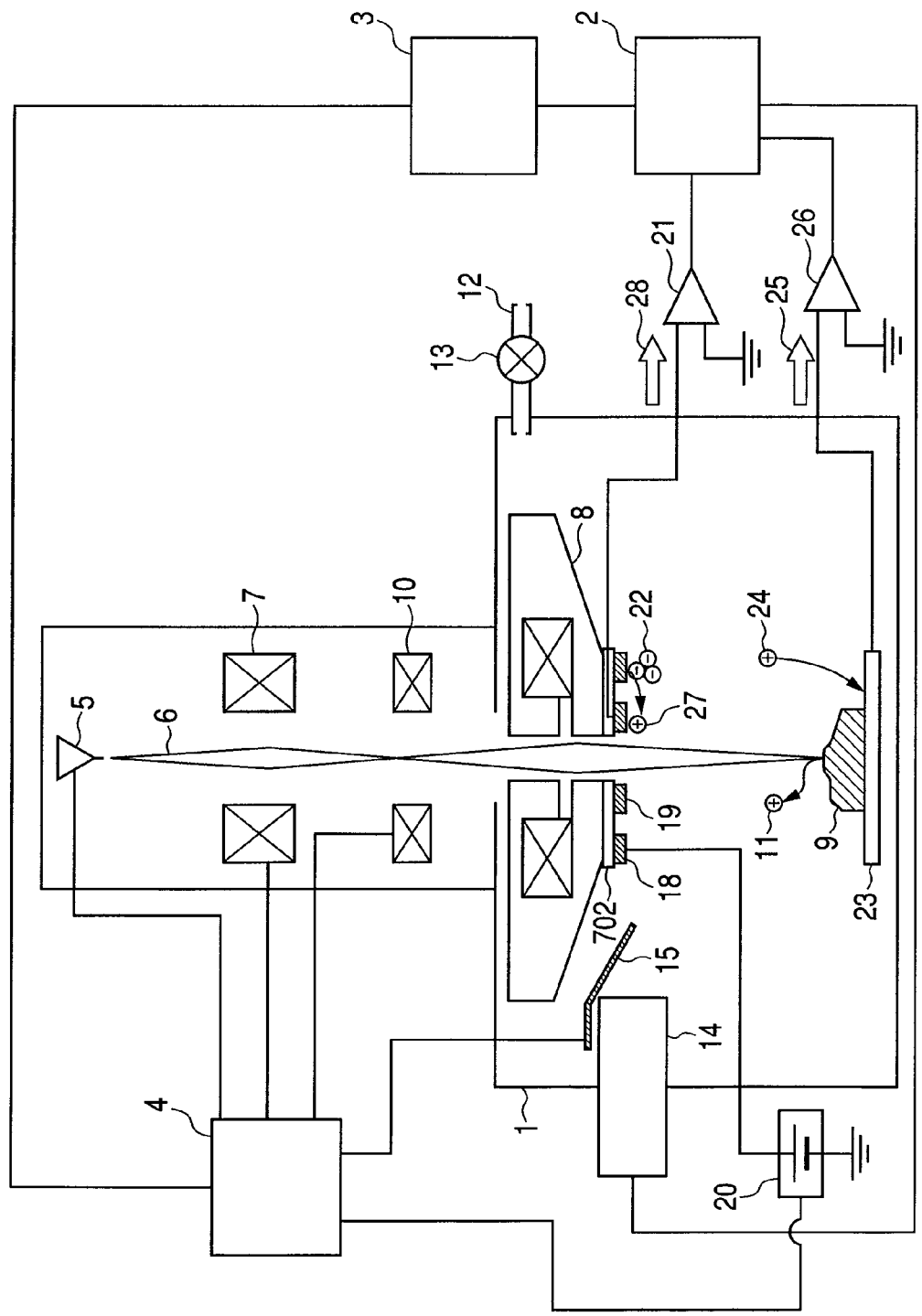
FIG. 12 is a diagram showing a configuration example of the scanning electron microscope where the arrangement position of the detector according to the ninth embodiment relating to the installation position of the detector is a lower surface of an objective lens.

Further, FIG. 12 schematically shows the ninth embodiment of the scanning electron microscope in a shape where an on axial secondary electron detector 702 having the same shape as the first embodiment is attached to the lower surface of the objective lens 8. In the configuration, the semiconductor detector is not installed below the objective lens 8. By the above-mentioned configuration, since the thickness of the detector itself is very thin as 100 µm or less, the effect, which does not limit the WD, can be obtained.

Moreover, FIG. 13 schematically shows the ninth embodiment of the scanning electron microscope in a shape where the detector 703 having the same shape as the third embodiment shown in FIG. 4 is attached to the outer surface of the objective lens 8. FIG. 13A is a diagram when the detector is vertically seen with respect to the optical axis 101 and FIG. 13B is a diagram when the detector is seen from the sample. The detector 703 according to the ninth embodiment can be used while being attached to the surface of the objective lens 8 that is a curved surface because the detector itself has flexibility. Such configuration has an effect that the surface of the objective lens, which is an original dead space, can be used as the holder of the secondary electron detector.

Further, the detection method of each of the secondary electron detectors 702 and 703 is the same as that of the foregoing secondary electron detectors, respectively.

Tenth Embodiment

In the tenth embodiment, in the scanning electron microscope including the secondary electron detector formed on the flexible thin film type substrate, a case where the detector of the tenth embodiment is applied to scanning electron microscope devising a semi-in-lens type objective lens shape so that the sample is in the magnetic field of the objective lens will be described.

Figure 14A:
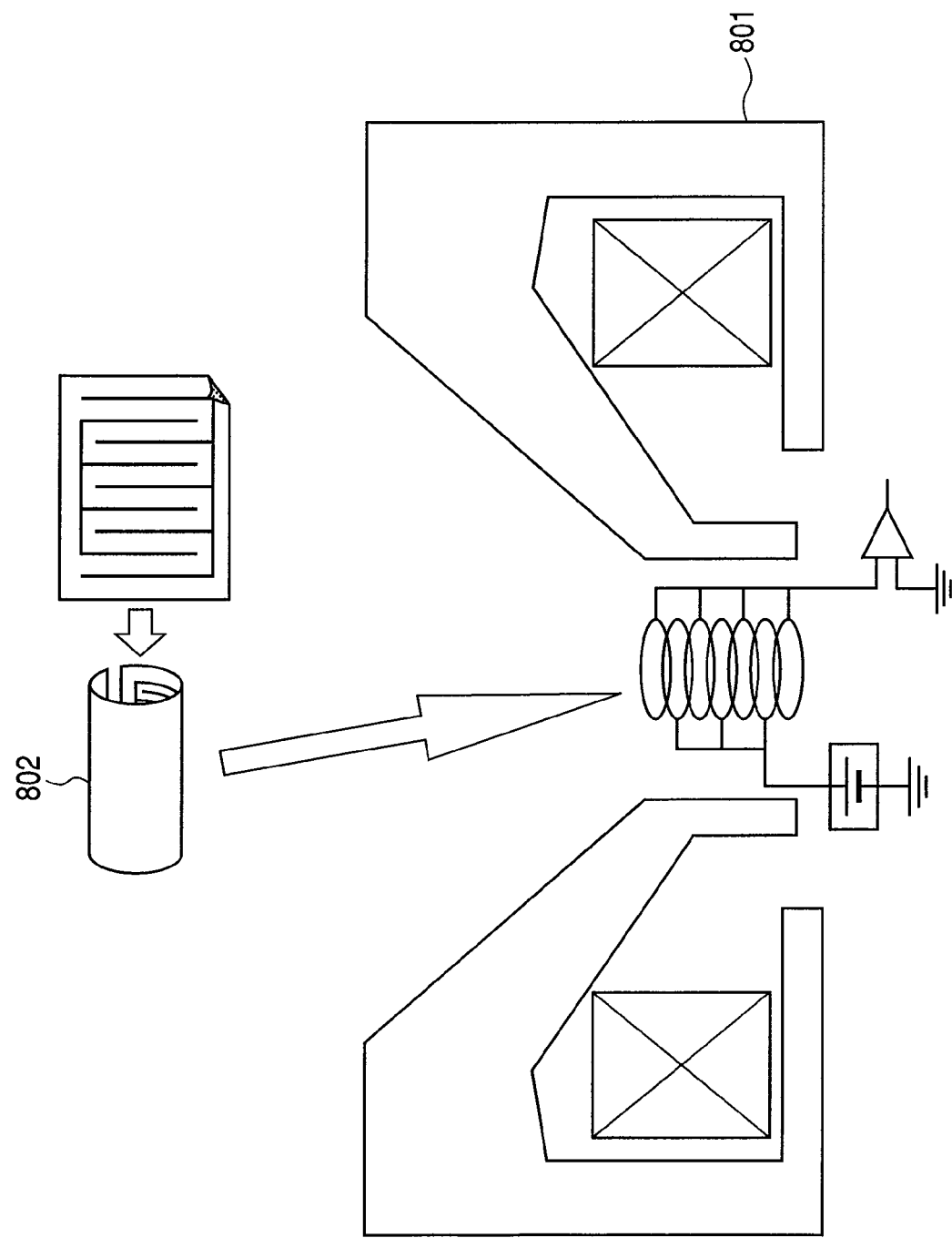
FIG. 14A is a diagram showing a configuration example (first example) of a scanning electron microscope according to a tenth embodiment relating to an installation position of a detector.
Figure 14B:
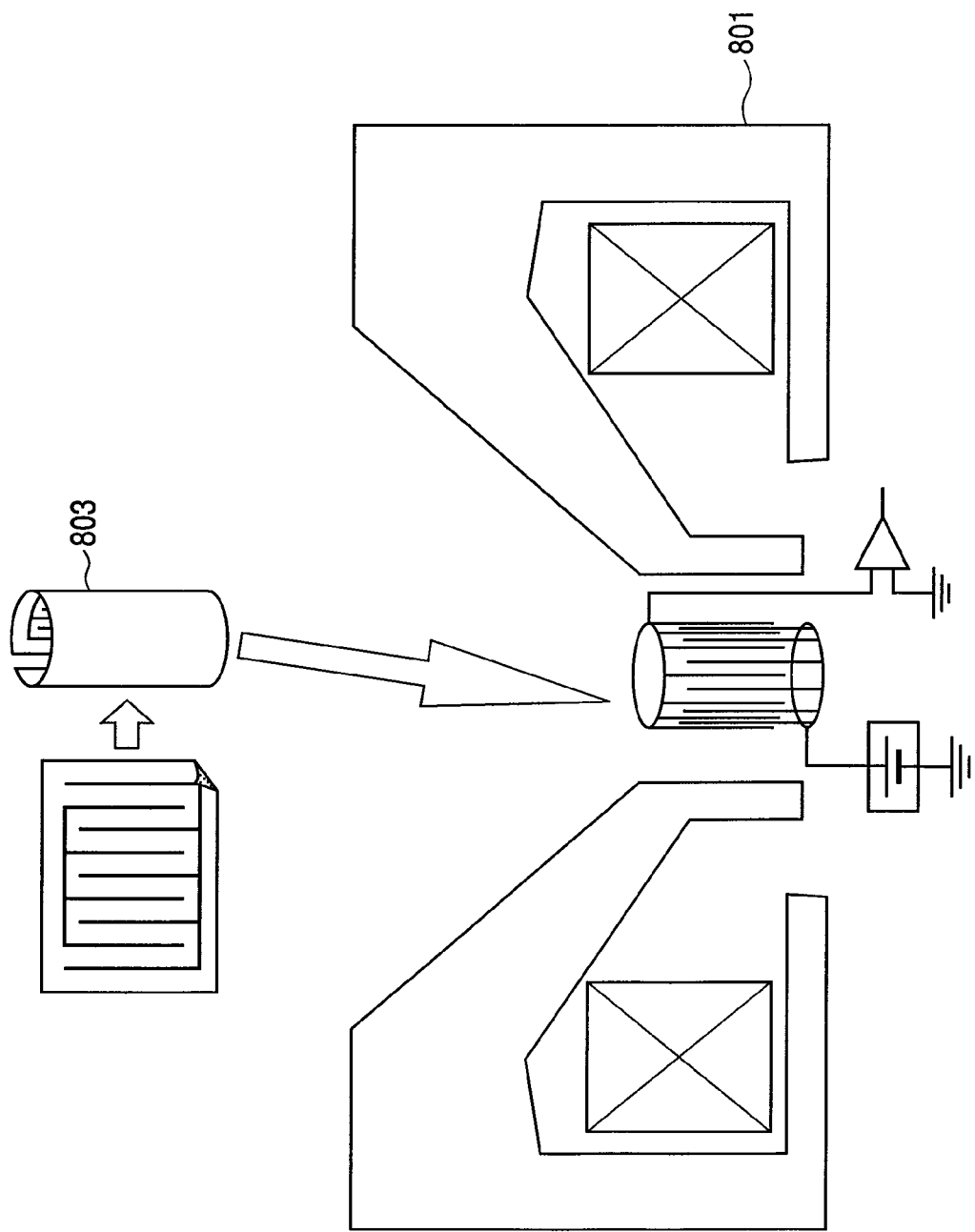
FIG. 14B is a diagram showing a configuration example (second example) of the scanning electron microscope according to the tenth embodiment relating to the installation position of the detector.
Figure 15:
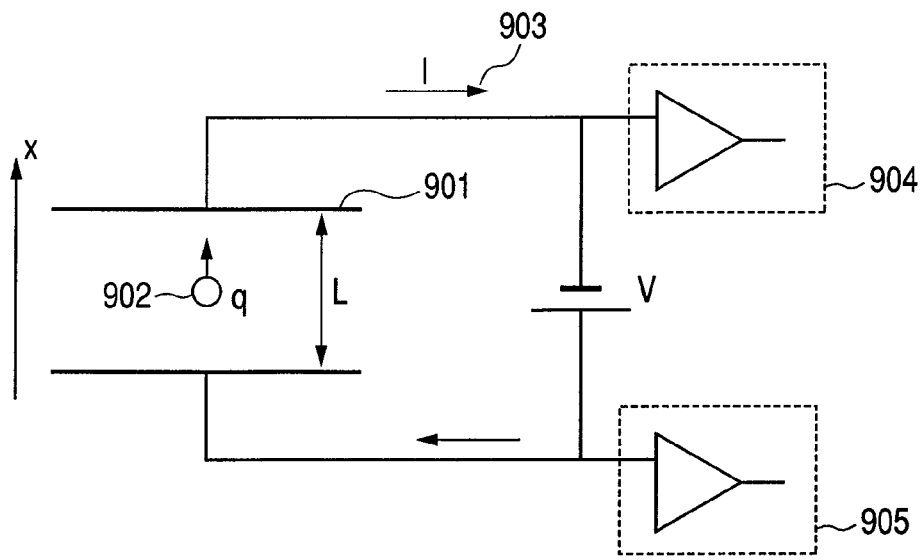
FIG. 15 is a diagram for explaining an displacement current.

FIGS. 14A and 14B schematically show the tenth embodiment when the detector is applied to the scanning electron microscope devising the semi-in-lens type objective lens 801 shape. The semi-in-lens type objective lens 801 has a shape devising a shape a pole piece so that the surface of the sample is intentionally exposed to lens magnetic field. By the above-mentioned configuration, aberration can be reduced and high resolution can be observed under the mainly short WD. In the tenth embodiment of FIG. 14A, the detector 802 having the same shape as the off axial secondary electron detector shown in FIG. 9B has a tubular shape so that the electrode has a circular shape and is arranged in a gap of the pole piece. Further, in the tenth embodiment of FIG. 14B, the detector 803 having the same shape as the off axial secondary electron detector shown in FIG. 9B has a tubular shape so that the electrode has a longitudinal comb shape and are arranged in a gap of the pole piece. Such configuration gives any methods an effect that the detector can arrange inside the semi-in-lens type objective lens with a small space.

What is claimed is:

1. A scanning electron microscope comprising:
   sample holder that maintains a sample to be observed;
   a sample chamber that receives the sample holder;
   an irradiation optical system that irradiates electron beams into the sample chamber;
   an objective lens that focuses the electron beams on the sample; and
   a detector that detects charged particles emitted from the sample by irradiating the electron beams,
   wherein the detector is configured of first and second electrodes that are formed on a substrate and detects a current flowing in the second electrode in a state in which a positive voltage is applied to the first electrode and a reference voltage is applied to the second electrode.

2. The scanning electron microscope according to claim 1, wherein the substrate on which the electrodes are formed is a flat type member having flexibility.

3. The scanning electron microscope according to claim 1, wherein the detector accelerates the charged particles emitted from the sample into the sample chamber by applying the positive voltage to the first electrode, amplifies the charged particles by interaction with gas molecules within the sample chamber, and detects the charged particles amplified within the sample chamber as current signals from second electrode to which the reference voltage is applied.

4. The scanning electron microscope according to claim 1, wherein the detector detects a movement of the charged particles in a direction along a surface of the substrate as an displacement current.

5. The scanning electron microscope according to claim 1, wherein the detector is arranged at a lower portion of the objective lens.

6. The scanning electron microscope according to claim 1, wherein the detector includes a plurality of detection surfaces that are segmented into an area amplifying and detecting the charged particles having different azimuth angles.

7. The scanning electron microscope according to claim 1, wherein the detector includes a plurality of detection surfaces that are segmented into an area amplifying and detecting the charged particles having different elevation angles.

8. The scanning electron microscope according to claim 1, wherein the detector is attached to a side surface of the objective lens, a lower surface of the objective lens, an inside of a pole piece of the objective lens, or a structure within the sample chamber.

9. The scanning electron microscope according to claim 1, wherein the objective lens is a semi-in-lens and the detector is arranged in a gap of the pole piece of the semi-in-lens in a tubular shape.

10. The scanning electron microscope according to claim 1, wherein the first and second electrodes are arranged in a layer shape in a vertical direction to the substrate surface via a thin film type insulator.

11. A scanning electron microscope comprising:
    an electron gun that generates primary electron beams;
    a sample chamber that receives a sample holder maintaining a sample;
    an irradiation optical system that irradiates the primary electron beams into the sample chamber;
    an objective lens that focuses the primary electron beams on the sample; and
    a secondary electron detector that detects secondary electrons generated from the sample by irradiating the primary electron beams,
    wherein the secondary electron detector is configured of a substrate and first and second electrodes and detects a current flowing in the second electrode in a state in which a positive voltage is applied to the first electrode and a reference voltage is applied to the second electrode.

12. The scanning electron microscope according to claim 11, wherein the substrate of the secondary electron detector is a flat type member having flexibility.

13. The scanning electron microscope according to claim 12, wherein the secondary electron detector is attached to a side surface of the objective lens, a lower surface of the objective lens, an inside of a pole piece of the objective lens, or an inner wall within the sample chamber.

14. The scanning electron microscope according to claim 11,
    wherein the sample chamber is maintained at a vacuum of 1 to several 1000 Pa at the time of irradiation the primary electron beams, and
    wherein the secondary electron detector accelerates the secondary electrons emitted from the sample into the sample chamber by applying the positive voltage to the first electrode, amplifies the secondary electrons by interaction with gas molecules within the sample chamber, and detects ions/electrons amplified within the sample chamber as a signal current from the second electrode to which the reference voltage is applied.

15. The scanning electron microscope according to claim 14, wherein the secondary electron detector detects a movement of ions/electrons in a direction along a surface of the substrate as an displacement current.

16. The scanning electron microscope according to claim 11, wherein the secondary electron detector is arranged at a low portion of the objective lens.

17. The scanning electron microscope according to claim 16, wherein the substrate of the secondary electron detector is formed in a doughnut shape that surrounds an optical axis of the primary electron beam.

18. The scanning electron microscope according to claim 17, wherein the first and second electrodes of the secondary electron detector are formed in a doughnut shape that surrounds an optical axis of the primary electron beam.

19. The scanning electron microscope according to claim 16, further comprising a back scattered electron detector that detects back scattered electrons generated from the sample by irradiating the primary electron beams and is arranged at a lower portion of the objective lens,
    wherein the secondary electron detector is installed at the electron gun side rather than a lower surface of the back scattered electron detector.

20. The scanning electron microscope according to claim 19, wherein the secondary electron detector is formed in a doughnut shape that surrounds an optical axis of the primary electron beam and the back scattered electron detector is installed inside the secondary electron detector in the doughnut shape.

* * * * *